United States Patent [19]

McDavid et al.

[11] Patent Number: 4,744,858

[45] Date of Patent: May 17, 1988

[54] INTEGRATED CIRCUIT METALLIZATION WITH REDUCED ELECTROMIGRATION

[75] Inventors: James M. McDavid, Dallas; Dirk N. Anderson, Plano, both of Tex.

[73] Assignee: Texas Instruments Incorporated, Dallas, Tex.

[21] Appl. No.: 710,346

[22] Filed: Mar. 11, 1985

[51] Int. Cl.$^4$ .................. B44C 1/22; C03C 15/00; C03C 25/06
[52] U.S. Cl. .................. 156/643; 156/644; 156/646; 156/653; 156/651; 156/657; 437/187; 437/192; 437/194; 437/228
[58] Field of Search .............. 156/643, 644, 646, 653, 156/657, 662, 651; 427/88–91; 357/65, 67, 68; 437/180, 187, 189, 192, 194, 203, 228, 235, 238, 241

[56] References Cited

U.S. PATENT DOCUMENTS 4,394,406 7/1983 Gardiner et al. .............. 156/644 X
4,508,815 4/1985 Ackmann et al. .............. 156/653 X Primary Examiner—William A. Powell
Attorney, Agent, or Firm—John G. Graham

[57] ABSTRACT

The specification discloses a method and a device wherein circuit elements (10) are formed on the surface of a semiconductor body (12). A layer of oxide (22) is applied over the circuit element (10). An aperture (32) is opened through the oxide layer (22). The surface of oxide layer (22) is nonuniformly substantially roughened. A layer of metal (24) such as aluminum is formed over the oxide layer (22) and extends into the aperture (32) for contact with a portion of the device (10). The layer of metal (24) has increased granular structure and a roughened exterior surface to provide enhanced electromigration properties.

17 Claims, 1 Drawing Sheet

INTEGRATED CIRCUIT METALLIZATION WITH REDUCED ELECTROMIGRATION

TECHNICAL FIELD OF THE INVENTION

This invention relates to semiconductor devices, and more particularly relates to metal contacts and interconnections for semiconductor integrated circuits with improved electromigration characteristics.

SUMMARY OF THE INVENTION

In accordance with the present invention, a method is provided for forming metal contacts with improved electromigration characteristics. Circuit elements are formed on a semiconductor surface and a layer of insulating material applied thereover. Apertures are opened in the insulating layer to selected portions of the circuit elements. The surface of the insulating layer is nonuniformly roughened. A layer of metal is applied on a portion of the insulating layer and extends into the apertures. The layer of metal forms a contact having a roughened exterior surface to provide enhanced electromigration properties. The surface of the insulating layer is roughened to an extent that the vertical thickness of the surface nonuniformly varies from 300 Å to 3000 Å and the lateral texture or feature size varies from 3000 Å to 10,000 Å.

In accordance with another aspect of the invention, a semiconductor device comprises a body of semiconductor material having a circuit element on a face thereof. An insulating layer is formed on the face and has a roughened surface, which may nonuniformly vary in thickness between 300 Å and 3000 Å. A contact aperture is formed through the insulating layer to provide contact with the circuit element. A conductive metal contact is formed over the insulating layer and into the contact aperture, the metal contact including a roughened surface which provides improved electromigration characteristics.

BACKGROUND OF THE INVENTION

Contacts and interconnections for VLSI semiconductor devices are normally formed by the deposition of a thin metal coating such as aluminum, which is then patterned to create the desired contacts and interconnections. With the increase in density of semiconductor devices, contact and interconnect resolution continues to be substantially reduced, resulting in extremely narrow metal strips. Problems have thus heretofore occurred with the use of such narrow metal strips due to electromigration. In electromigration, the atoms of the metal may be physically moved by the high current flowing therethrough, creating pillars and holes within the metal strip. This can result in failure of the metal strip due to an open circuit or due to a substantial increase in the resistance of the metal strip.

Prior techniques have been heretofore developed for making metal-to-silicon contacts through thick oxide in an effort to reduce electromigration failures. For example, in pending U.S. patent application Ser. No. 425,789, filed Sept. 28, 1982, now abandoned, by D. N. Anderson entitled, "Stratified Insulator Coating for Improved Contacts in VLSI Devices", a method is disclosed of forming sloping contact sidewalls by etching differing phosphorus concentrations in the oxide layer. In pending U.S. patent application Ser. No. 410,755, filed Aug. 23, 1982, U.S. Pat. No. 4,507,853, by James M. McDavid, entitled "Metalization Process for Integrated Circuits", two metal depositions are utilized to provide a smoother sidewall transition and a greater thickness at steps.

Conventional techniques for control of electromigration generally employ direct alterations of the metallurgical properties of the deposited metal layer, including control of the grain size and grain boundary composition of the metal. For example, an additional metal such as copper is often used as a dopant for the aluminum. Alternatively, silicon doped aluminum interconnects are commonly used. However, such techniques for varying the metallurgical properties of the metal layer often cause a negative effect on the electrical performance of dynamic RAMs because of the copper. Also, difficulties occur because an additional metal is not usually included in processes which use chemical vapor deposition of aluminum to produce conformal metallization.

Another approach for increasing the grain size of aluminum strips has been to increase the pressure in argon sputtering of the aluminum. However, this has produced increased impurities in the aluminum and does not produce an optimum result.

A need has thus arisen for a technique for enabling the control of the metal texture, and hence, the electromigration resistance, of metal contacts and interconnects without requiring doping with a second metal or varying conventional metal deposition techniques.

BRIEF DESCRIPTION OF THE DRAWINGS

For further aspects and advantages of the present invention, reference is now made to the following description taken in conjunction with the accompanying drawings, in which.

DETAILED DESCRIPTION OF THE INVENTION

Figure 1:
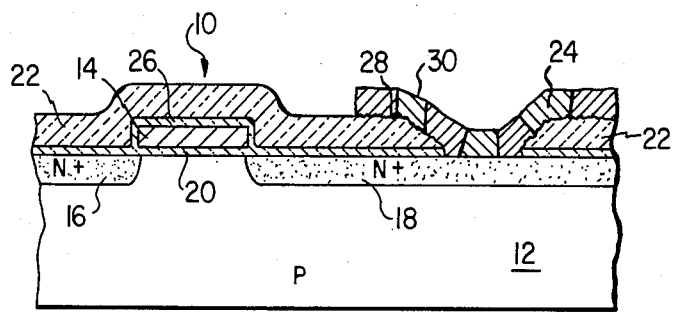
FIG. 1 is a somewhat diagrammatical illustration of a metal contact and interconnect formed in accordance with the present invention.

FIG. 1 is a diagrammatic cross-section of a typical metal contact and interconnect formed in accordance with the invention. The illustrated semiconductor device is an MOS transistor generally identified by the numeral 10 which is formed on a semiconductor bar 12. The transistor includes a polysilicon gate 14 and N+ source/drain regions 16 and 18 formed within bar 12. A thin gate oxide 20 insulates the polysilicon gate 14. The illustrated MOS transistor 10 is described in greater detail in U.S. Pat. Nos. 4,055,444 and 4,240,092, assigned to Texas Instruments Incorporated.

Low temperature deposited oxide 22 covers the face of the semiconductor bar 12 to insulate the polysilicon gate 14 from a metal interconnect strip 24 at cross-over positions. A thinner layer 26 of thermal silicon oxide is normally grown between the deposited oxide 22 and the polysilicon gate 14. The metal strip 24 may be comprised of aluminum, for example, and extends through an aperture formed in the oxide layer 22 in order to contact the N+ region 18. It is important that the aluminum strip 24 be provided with optimum electromigration properties in order to prevent open circuit or high resistance failure of the circuit.

In accordance with the invention, a surface 28 of the oxide layer 22 is substantially roughened prior to the deposition of the metal strip 24. Consequently, upon the formation of the metal strip 24, the outer surface 30 and metallurgical grain size and boundary of the metal strip is changed to substantially improve the electromigration properties of the strip. Specifically, the grain size of the metal strip 24 is substantially increased and substantially larger columnar grains are grown within the metal strip during formation thereof to decrease the chance of electromigration.

It should be understood that only a small portion of the overall semiconductor body is illustrated in FIG. 1. The device shown in FIG. 1 may comprise, for example, a memory device as illustrated in U.S. Pat. Nos. 4,239,993 and 4,314,362 or, alternatively, may comprise a microcomputer device as shown in U.S. Pat. Nos. 4,074,351 and 3,991,305, all assigned to Texas Instruments Incorporated. The device may also employ a double level polysilicon as disclosed in U.S. Pat. No. 4,240,092, instead of the single level of polycrystalline silicon 14 as illustrated.

Figure 2:
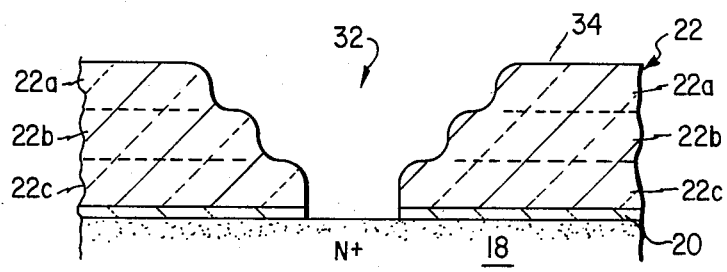
FIG. 2 is a somewhat diagrammatical illustration of an initial step in the formation of a device according to the present method.
Figure 3:
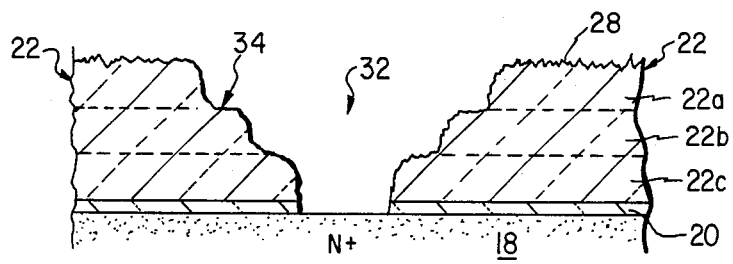
FIG. 3 is a diagrammatical illustration of a subsequent step in accordance with the present invention.
Figure 4:
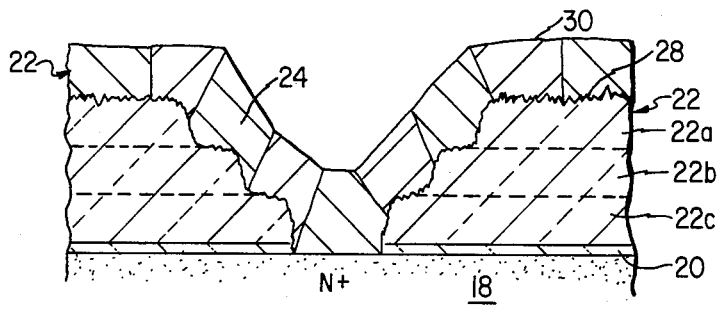
FIG. 4 is a somewhat diagrammatic cross-section of the final step of formation of a metal contact in accordance with the present invention which includes improved electromigration characteristics.

FIGS. 2-4 illustrate a method of making the device of FIG. 1. In FIG. 2, only the contact portion of the device shown in FIG. 1 is illustrated for clarity of illustration. Transistor 10, not shown, has previously been completed in FIG. 2 by a conventional series of steps of depositions, oxidation and impurity implant steps using photoresist masking, as set forth in U.S. Pat. Nos. 4,055,444, 4,240,092 and 4,219,328. A thick oxide layer 22 has been formed over the oxide layer 20 and the N+ region 18. Oxide layer 22 may vary in thickness from 7000 Å to 18,000 Å.

According to one embodiment of the invention, the layer 22 is formed of three layers 22a, 22b and 242c of differing phosphorus concentrations. The oxide layer 22 has been subjected to an etch in order to form an aperture 32 for enabling contact with the N+ region 18. Due to the differing phosphorus concentration of the oxide layer 22, a differential etch rate is provided. The etch forms receding layers as illustrated, thereby making the sidewalls of the aperture 32 smoother by limiting the height of any individual step. For example, oxide layer 22 may be comprised of silicon oxide containing from about 0% to about 12% phosphorus, in a descending manner. In order to shield the phosphorus in the oxide layer 22 from the metal to be applied, the upper coating 24a may include plasma-deposited lightly-doped oxide. A high temperature "reflow" step may also be performed on the oxide layer 26, thus smoothing the surface of the layer to a vertical roughness which will normally not exceed 10 Å. More specific detail of the method for forming the sloped sidewall configuration shown in FIG. 2 is described in the pending patent application Ser. No. 425,789, filed Sept. 28, 1982 by D. N. Anderson, previously noted, the disclosure therein being herein incorporated by reference.

Although the use of oxide with varying concentrations of phosphorus doping is advantageous for use with the invention, it is not a limiting feature of the present invention. The present invention can also be advantageously utilized with conventional oxides without phosphorus doping.

FIG. 3 illustrates the next step in fabrication of a device in accordance with the present invention, wherein the outer surface 28 of the oxide layer 22 is substantially roughened. It will be understood that numerous methods of roughening the surface 28 of the oxide 22 may be employed. For example, a plasma or reacting etch may be utilized to nonuniformly remove varying portions of the oxide layer 22. The plasma etch may be operated to provide a 100 Å per second removal rate to provide a vertical roughness of from 300 Å to 3000 Å on surface 28 and lateral texture or feature size which varies from 3000 Å to 10,000 Å. The lateral texture is an important indicator of grain size. The plasma or reactive ion etch is a conventional technique as disclosed in U.S. Pat. No. 4,297,162.

Alternatively, the surface 28 may be roughened with the use of a wet etch employing an acid mixture such as hydrofluoric and nitric acid. As the phosphorus concentration in oxide layer 22 is varied, the etch rate provides a nonuniformly roughened surface. In this aspect of the invention, a 10% dilution solution of hydrofluoric and nitric acid may provide an etching rate of 1000 Å per minute and may be used to provide an extremely roughened surface 28 wherein the vertical roughness varies between 300 and 3000 Å and the lateral texture or feature size varies between 3000 and 10,000 Å.

In yet another aspect of the invention, the oxide layer 22 may be heat treated at 950° C. for approximately 30 minutes. Due to the differing phosphorus doped levels 24a-c, the heating and subsequent cooling of the layer causes local stresses, roughening and microcracks in the oxide layer 22. This technique can also provide a vertical roughness of surface 28 which varies between 300 Å and 3000 Å and a lateral texture or feature size which varies between 3000 Å and 10,000 Å.

After roughening of the oxide layer 22 as shown in FIG. 3, the metal strip 24 is applied. The metal layer 22 will normally comprise aluminum, aluminum silicon, aluminum-silicon-titanium or similar metals. Alternatively, the metal strip 24 may comprise a tungsten layer with an upper aluminum layer. Due to the roughened surface 28, the aluminum strip 24 is formed with relatively large grain and large columnar grains to provide an enhancement in electromigration resistance. The aluminum layer 24 is deposited by conventional techniques and doping with additional metals such as copper is not required in order to provide enhanced electromigration properties. The roughness of surface 28 causes not only the grain size of the aluminum to be increased, but the outer surface 30 of the aluminum to be roughened, which prevents electromigration problems.

Aluminum interconnects formed by the present invention were tested for electromigration failure at high temperatures of up to 250° C. and a high current density of $2 \times 10^6 x/Cm^2$. The indirect control of the metal texture in accordance with the invention improved the meantime-to-failure due to electromigration of conventional aluminum conductors by a factor of ten.

Although the present invention has been described with an oxide layer of varying phosphorus doping, it will be understood that the present invention may also be utilized to provide roughening of a conventional nondoped oxide layer by providing the desired roughness in accordance with the invention. Further, although various techniques for roughening the oxide layer have been described, it will be understood that additional techniques for roughening the oxide layer to the desired degree may also be employed.

Although the preferred embodiment has been described in detail, it should be understood that various changes, substitutions and alterations can be made therein without departing from the spirit and scope of the invention as defined by the appended claims.

What is claimed is:

1. A method of making a semiconductor device comprising:
   forming circuit elements on a semiconductor surface,
   applying an insulating layer over said circuit elements,
   opening apertures in said insulating layer to selected portions of said circuit elements,
   nonuniformly roughening the surface of said insulating layer, and
   applying a layer of metal on a portion of said insulating layer extending into said apertures, said layer of metal having a granular interior and a roughened surface to provide enhanced electromigration properties.

2. The method of claim 1 wherein the surface of said insulating layer is roughened such that the vertical thickness of the surface nonuniformly varies from 300 Å to 3000 Å and the lateral feature size varies from 3000 Å to 10,000 Å.

3. The method of claim 1 wherein said step of roughening comprises plasma etching.

4. The method of claim 1 wherein said step of roughening comprises reactive ion etching.

5. The method of claim 1 wherein said step of roughening comprises acid etching.

6. The method of claim 1 wherein said step of roughening comprises applying heat to create microcracks in said insulating layer.

7. The method of claim 1 wherein said layer of metal is formed from aluminum.

8. A method of forming metal contacts with improved electromigration characteristics comprising:
   forming circuit elements on a surface of a semiconductor body,
   applying layers of oxide having differing impurity doping concentrations over said circuit elements,
   opening apertures through said layers of oxide into contact with said circuit elements,
   modifying the outer surface of said oxide layers to provide substantial nonuniform variations in the thickness thereof, and
   applying a pattern of metal contacts over said oxide layers extending into said apertures, said metal contacts having increased grain size to provide enhanced electromigration properties.

9. The method of claim 8 wherein said step of modifying comprises roughening said outer surface such that the thickness nonuniformly varies between 300 Å to 3000 Å and the lateral feature size varies from 3000 Å to 10,000 Å.

10. The method of claim 8 wherein said step of modifying comprises plasma etching.

11. The method of claim 8 wherein said step of modifying comprises reactive ion etching.

12. The method of claim 8 wherein said step of modifying comprises acid etching.

13. The method of claim 8 wherein said step of modifying comprises applying heat to said layers to cause the formation of microcracks due to said differing doping concentrations.

14. The method of claim 8 wherein said impurity concentrations comprises phosphorus.

15. The method of claim 14 wherein said oxide layers include phosphorus at successively higher concentrations.

16. The method of claim 8 wherein said semiconductor body comprises silicon and said oxide comprises silicon oxide.

17. The method of claim 8 wherein said metal comprises aluminum.

* * * * *